(12) United States Patent
Matsumoto (10) Patent No.: US 9,477,209 B2
(45) Date of Patent: Oct. 25, 2016

(54) POWER GENERATOR, TIMEPIECE, AND METHOD FOR MANUFACTURING POWER GENERATOR

(71) Applicant: SEIKO EPSON CORPORATION, Tokyo (JP)

(72) Inventor: Tetsuro Matsumoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 4 days.

(21) Appl. No.: 14/631,114

(22) Filed: Feb. 25, 2015

(65) Prior Publication Data

US 2015/0253741 A1    Sep. 10, 2015

(30) Foreign Application Priority Data

Mar. 6, 2014 (JP) ................. 2014-043720

(51) Int. Cl.
*G04C 10/00* (2006.01)
*G04G 19/00* (2006.01)
*H01L 31/02* (2006.01)

(52) U.S. Cl.
CPC ............. *G04G 19/00* (2013.01); *G04C 10/00* (2013.01); *H01L 31/02* (2013.01); *Y10T 29/49117* (2015.01)

(58) Field of Classification Search
CPC .......... H01L 31/0463; H01L 21/3083; H01L 31/02008; H01L 31/02; G04G 19/00; G04C 10/00

USPC .......................................... 368/205
See application file for complete search history.

(56) References Cited

U.S. PATENT DOCUMENTS

| | | | | |
|---|---|---|---|---|
| 4,354,115 A | * | 10/1982 | Warabisako | .... H01L 31/035281 136/244 |
| 4,805,006 A | * | 2/1989 | Yamaguchi | ....... H01L 27/14643 136/244 |
| 5,128,736 A | * | 7/1992 | Yoshida | ............. H01L 27/1443 136/244 |
| 5,716,459 A | * | 2/1998 | Chang | ............ H01L 31/035272 136/249 |
| 6,466,522 B1 | | 10/2002 | Yoshioka et al. | |
| 7,746,731 B2 | * | 6/2010 | Murakami | ............. G04C 10/02 136/244 |
| 2011/0088747 A1 | * | 4/2011 | Alstrup | ................. H01L 27/307 136/244 |
| 2015/0228827 A1 | * | 8/2015 | Casse | ................. H01L 31/0406 136/253 |
| 2015/0255652 A1 | * | 9/2015 | Namjoshi | ........... G06F 17/5072 136/244 |

FOREIGN PATENT DOCUMENTS

JP    H09-243759 A    9/1997
JP    2007-292787 A    11/2007

* cited by examiner

*Primary Examiner* — Sean Kayes
(74) *Attorney, Agent, or Firm* — Oliff PLC (57) ABSTRACT

A power generator includes a photocell having a sheet-like shape provided with an opening therethrough and another photocell having a sheet-like shape that is accommodated in the opening and connected to the photocell in series. The center of the opening coincides with the center of the another photocell.

6 Claims, 8 Drawing Sheets

POWER GENERATOR, TIMEPIECE, AND METHOD FOR MANUFACTURING POWER GENERATOR

This application claims a priority to Japanese Patent Application No. 2014-043720 filed on Mar. 6, 2014 which is hereby expressly incorporated by reference in its entirety.

BACKGROUND

1. Technical Field

Several aspects of the present invention relate to the structure of a power generator using a sheet-shaped photocell and a method for manufacturing the power generator.

2. Related Art

There is a known wristwatch that uses a sheet-shaped photocell (solar cell). In a wristwatch of this type, a dial is provided on the surface of the photocell (JP-A-9-243759, for example). A light-transmissive color filter is used as the dial. Further, to produce a desired voltage, a plurality of sheets need to be connected to each other in series in some cases. To connect a plurality of sheets to each other in series, there is a known technology using a thin wiring sheet (JP-A-2007-292787, for example).

In the technology described in JP-A-9-243759, the underlying photocell is visible through the color filter in some cases depending on the characteristics of the color filter. In this case, the exterior appearance of the timepiece is undesirably degraded. The technology described in JP-A-2007-292787 causes an increase in the number of parts and requires the step of attaching the wiring sheet, resulting in an increase in cost.

SUMMARY

An advantage of some aspect of the invention is to provide a power generator that can be manufactured by using sheet-shaped photocells in a simplified method without degradation in exterior appearance of a timepiece.

An aspect of the invention provides a power generator including a first photocell having a sheet-like shape provided with an open portion therethrough and a second photocell having a sheet-like shape that is accommodated in the open portion and connected to the first photocell in series, with the center of the open portion being the center of the second photocell.

According to the power generator described above, the possibility of degradation in exterior appearance is lowered.

The second photocell may be so shaped that it overlaps with the first photocell when the second photocell in a state in which the entire second photocell is accommodated in the open portion is rotated around a point in the open portion.

According to the power generator with this configuration, the first photocell and the second photocell are readily allowed to be in contact with each other.

The open portion may have a rotationally symmetric shape so modified that a shape provided with at least one of a recess and a protrusion that differs from the rotationally symmetric shape in terms of distance from the center of rotation is added to the rotationally symmetric shape.

According to the power generator with this configuration, the first photocell and the second photocell are allowed to be in contact with each other when rotated relative to each other.

The rotationally symmetric shape may be a circle.

According to the power generator with this configuration, the flexibility of the rotating operation in a manufacturing process can be increased as compared with a case where the rotationally symmetric shape is not a circle.

The area of the first photocell that contributes to power generation may be equal to the area of the second photocell that contributes to power generation.

According to the power generator with this configuration, current can be efficiently extracted as compared with a case where the areas of the first photocell and the second photocell differ from each other.

Another aspect of the invention provides a timepiece including a first photocell having a sheet-like shape provided with an opening therethrough and a second photocell having a sheet-like shape that is accommodated in the opening and connected to the first photocell in series.

According to the timepiece described above, the possibility of degradation in exterior appearance is lowered.

Still another aspect of the invention provides a method for manufacturing a power generator including producing a first piece from a single photocell sheet in a punching process, producing a second piece from the first piece in a punching process, and causing the first piece to function as a first photocell and the second piece to function as a second photocell and connecting the first photocell and the second photocell to each other in series.

According to the manufacturing method, a power generator having a lowered possibility of degradation in exterior appearance can be readily manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Structure

Figure 1:
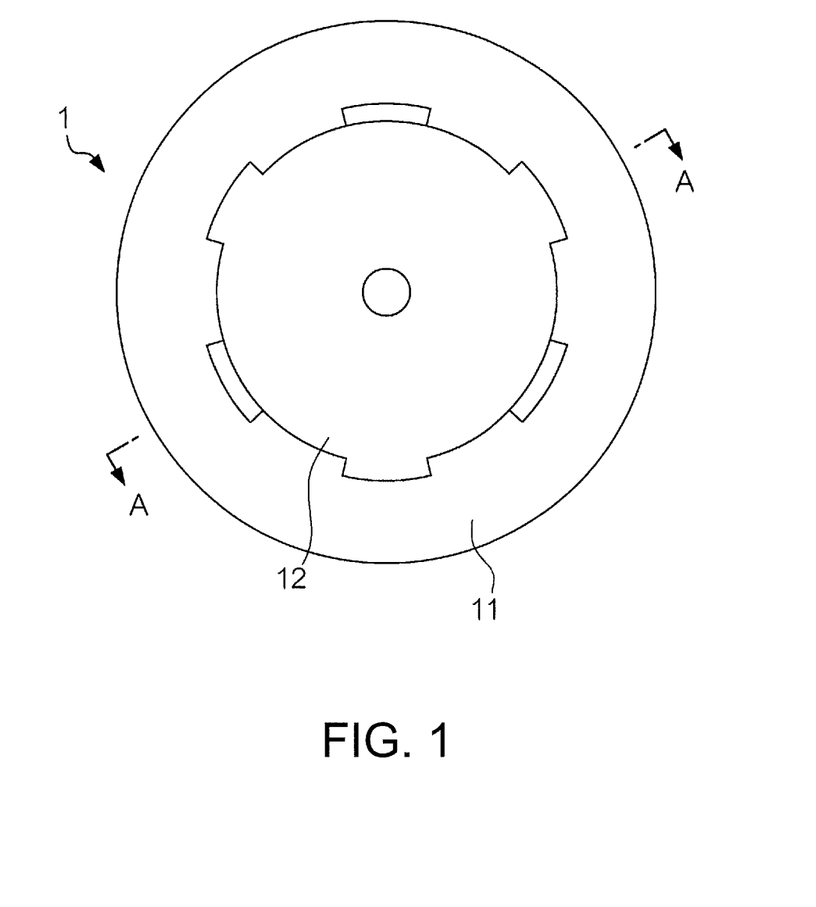
FIG. 1 shows the configuration of a power generator according to an embodiment.

FIG. 1 shows the configuration of a power generator 1 according to an embodiment. The power generator 1 is a device that generates power in response to light received by a light receiving surface or what is called a photocell (solar cell) device. FIG. 1 is a front view of the light receiving surface of the power generator 1. The power generator 1 is used in an electronic apparatus, for example, a wristwatch. The power generator 1 has a shape that is accommodated in a case (enclosure) of a wristwatch, that is, has the same shape and size as those of a dial of the timepiece. The power generator 1 includes a photocell 11 and a photocell 12. In this example, a single photocell cannot produce a desired voltage, and the desired voltage is produced by the photocell 11 and the photocell 12 connected to each other in series.

Figure 2A:
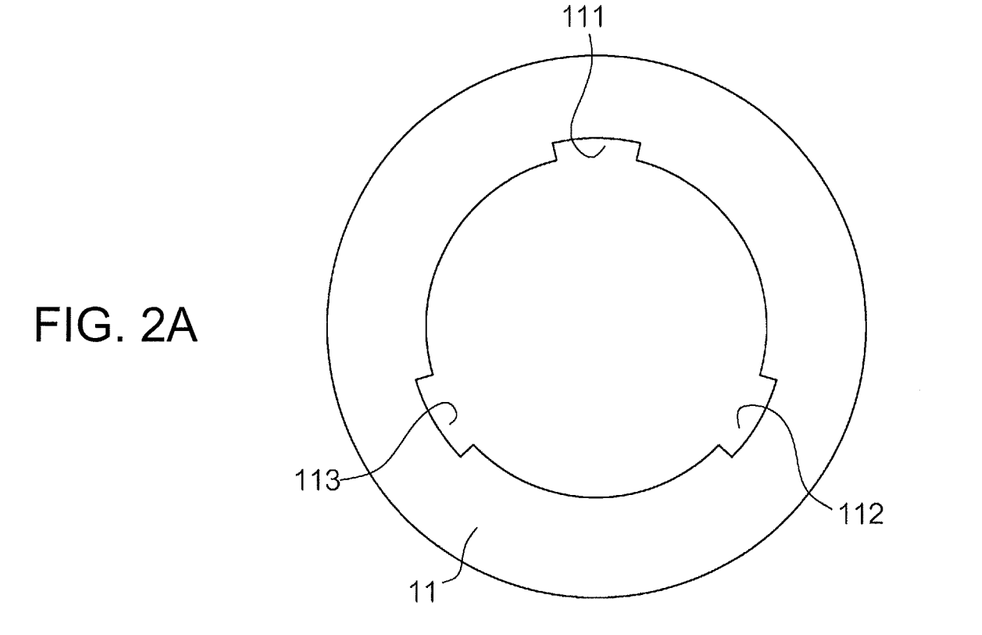
FIGS. 2A and 2B show the shapes of photocells.
Figure 2B:
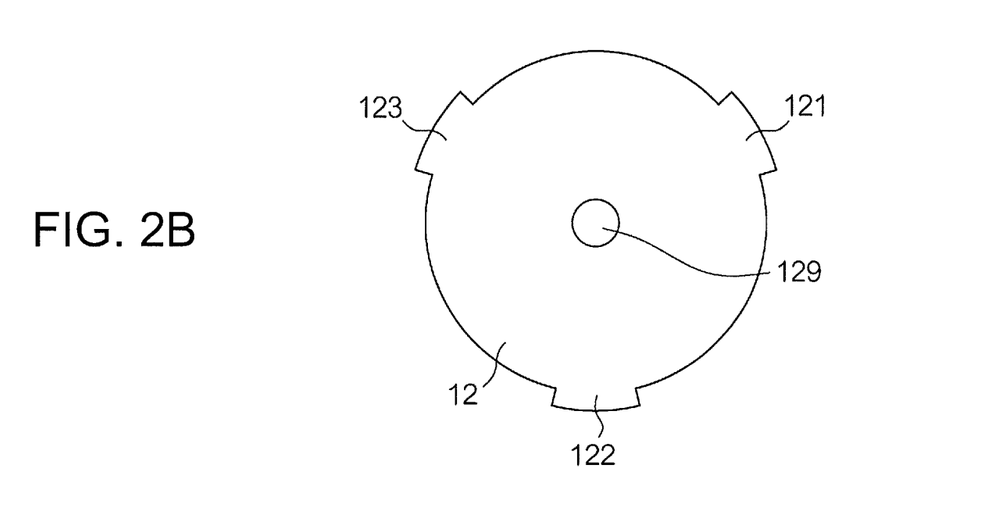

FIGS. 2A and 2B show the shapes of the photocell 11 and the photocell 12. FIG. 2A shows the shape of the photocell 11, and FIG. 2B shows the shape of the photocell 12. Each of the photocell 11 and the photocell 12 is a sheet-shaped (film-shaped) photocell. The sheet-shaped photocell has a substrate and a solar cell layer formed on the substrate. The substrate is formed, for example, of a plastic film. The solar cell layer contains, for example, amorphous silicon.

The photocell 11 has a rim-like (ring-like) shape having a central opening (open portion). The rim of the photocell 11 has a non-uniform width, and part of the rim forms a recess. In the example shown in FIG. 2A, recesses are formed at three locations (recess 111, recess 112, and recess 113).

The photocell 12 has a substantially circular outer shape that is not completely circular, and part of the circle forms a protrusion. In the example shown in FIG. 2B, protrusions are formed at three locations (protrusion 121, protrusion 122, and protrusion 123). The photocell 12 further has a central hole 129. The hole 129 is a hole that allows hands of a timepiece to pass.

As will be described later, the photocell 12 is produced from the photocell 11 in a punching process, and the opening of the photocell 11 and the outer shape of the photocell therefore have substantially the same shape. The protrusions 121, 122, and 123 of the photocell 12 overlap with the photocell 11, and the overlapping portions provide electrical connection.

In this example, the center of the opening of the photocell 11 is the center of the photocell 12. That is, the two centers coincide with each other. The center of the opening of the photocell 11 is, for example, the center of gravity of the opening. Instead, the opening may be so reshaped that it approximates a circle and the center of the approximate circle may be the center of the opening. The approximate circle is, for example, a circle that inscribes the opening and has a maximum area among the inscribed circles. The center of the photocell 12 is, for example, the center of gravity of the photocell 12. Instead, the photocell 12 may be so reshaped that it approximates a circle, and the center of the approximate circle may be the center of the photocell 12. The approximate circle is, for example, a circle that inscribes the outer shape of the photocell 12 and has a maximum area among the inscribed circles.

Figure 3:
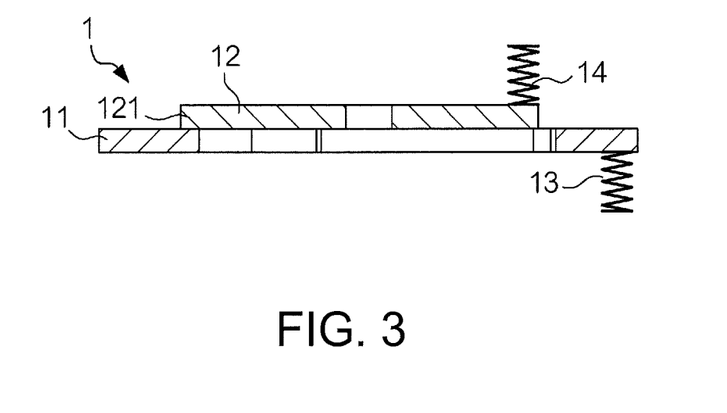
FIG. 3 is a diagrammatic view showing a cross section of the power generator.

FIG. 3 is a diagrammatic view showing a cross section of the power generator 1. FIG. 3 shows a cross section taken along the line A-A in FIG. 1. The protrusion 121 of the photocell 12 is boned to the photocell 11. The power generator 1 further includes an electrode 13 and an electrode 14. Each of the electrodes 13 and 14 is an electrode through which electric power generated by the photocells 11 and 12 is extracted. In this example, the electrode 13 is provided on the light receiving surface of the photocell 11, and the electrode 14 is provided in a position in the vicinity of the end of the rear surface of the photocell 12 (surface facing away from light receiving surface). Each of the electrodes 13 and 14 is, for example, a coil spring.

The photocell 11 and the photocell 12 are so designed that they have the same power generating area. The power generating area is an area of a portion (area that contributes to power generation) exposed when the power generator 1 is assembled in an electronic apparatus (timepiece in this example). That is, when the photocell 11 and the photocell 12 are irradiated with light having the same illuminance, the two cells show the same current-voltage (I-V) characteristic. Using photocells having the same power generating area provides an advantageous effect of no decrease in power generation efficiency. It is noted that the "same" power generating area not only includes a case where two power generating areas are completely equal to each other but also a case where a difference between two power generating areas falls within a predetermined range (within ±10%, for example).

According to the present embodiment, the boundary between the photocell 11 and the photocell 12 is roughly circular and hence has a highly symmetric shape. As a result, a desired power generation function can be provided without degradation in the exterior appearance of a timepiece.

2. Manufacturing Method

Figure 4:
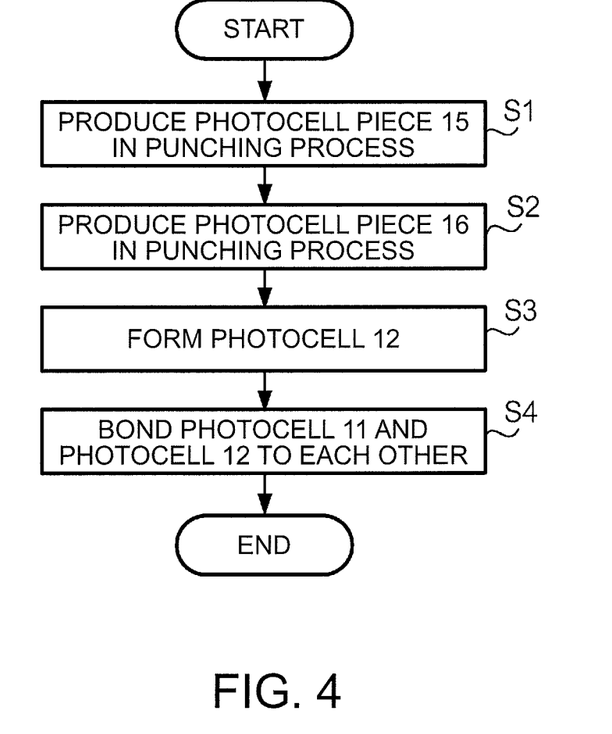
FIG. 4 is a flowchart showing an example of a method for manufacturing the power generator.

FIG. 4 is a flowchart showing an example of a method for manufacturing the power generator 1. FIGS. 5 to 9 describe the states in manufacturing steps. In this example, the power generator 1 is manufactured by using a single sheet-shaped photocell (hereinafter referred to as photocell sheet).

Figure 5:
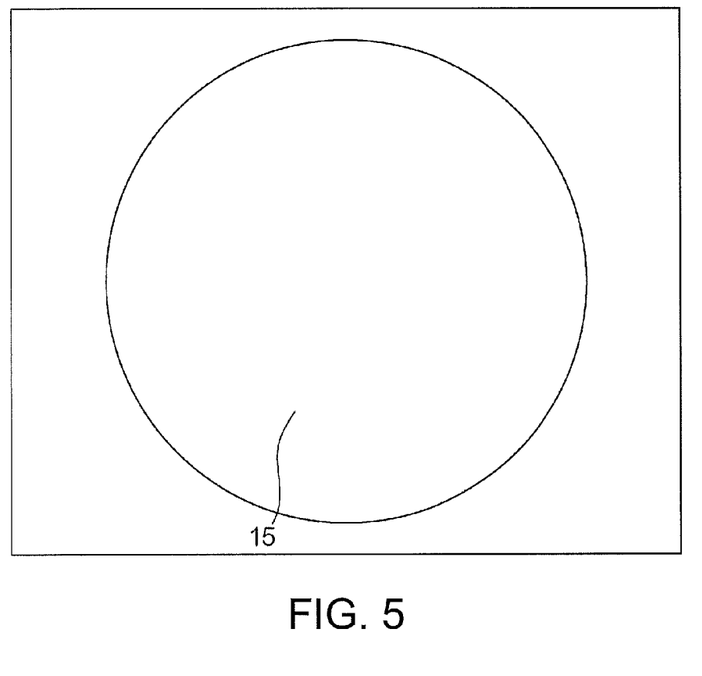
FIG. 5 shows an example of the state after step S1 is carried out.

In step S1, a portion having a shape that conforms to the outer shape of the photocell 11 is produced from the photocell sheet in a punching process (FIG. 5). The photocell 11 has a circular outer shape. The portion produced in the punching process is hereinafter referred to as a photocell piece 15.

Figure 6:
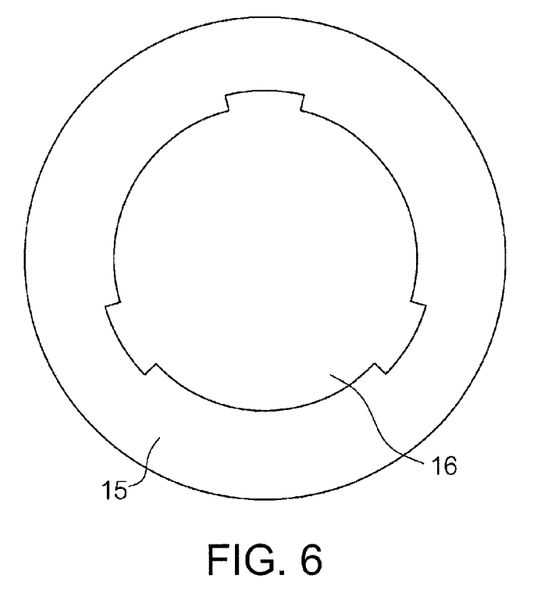
FIG. 6 shows an example of the state after step S2 is carried out.
Figure 7:
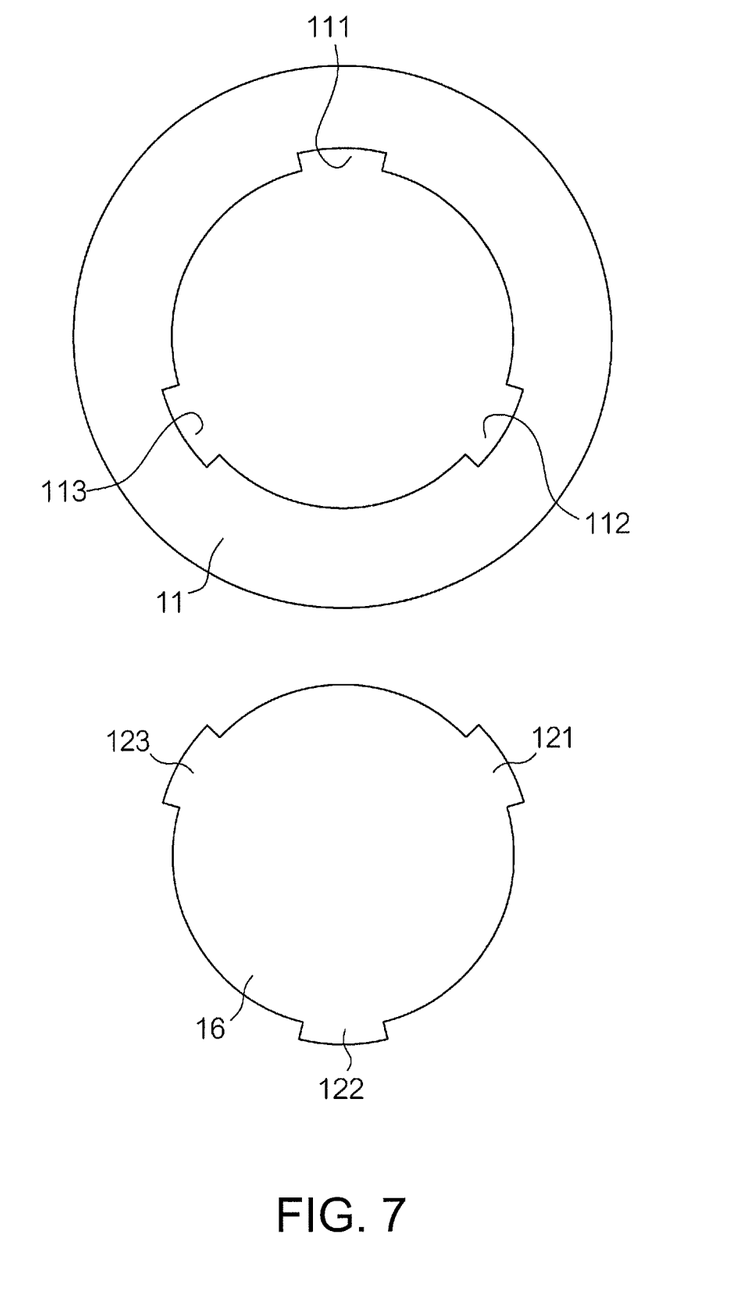
FIG. 7 shows another example of the state after step S2 is carried out.

In step S2, a portion having a shape that conforms to the outer shape of the photocell 12 is produced from the photocell piece 15 in a punching process (FIG. 6). The photocell 12 has an outer shape based on a circle. The center of the circle coincides with the center of the circular outer shape of the photocell 11. Part of the outer shape based on a circle forms a protrusion. In this example, three protrusions are formed. The three protrusions are symmetrically positioned with respect to the center of the photocell 12. That is, the angle between the lines that connect representative points of each of the protrusions to the center of the circle is 120° (=360°/3). That is, it can be said that the three protrusions are provided at angular intervals of 120° along the circumference. The portion produced in the punching process is hereinafter referred to as a photocell piece 16. After the photocell piece 16 is produced from the photocell piece 15 in the punching process, the left portion forms the photocell 11 (FIG. 7).

The photocell 12, which has the protrusions, has a shape that overlaps with the photocell 11 when the photocell 12 is rotated relative to the photocell 11. That is, the protrusions are portions that differ from the circle in terms of distance from the center of the circle.

Figure 8:
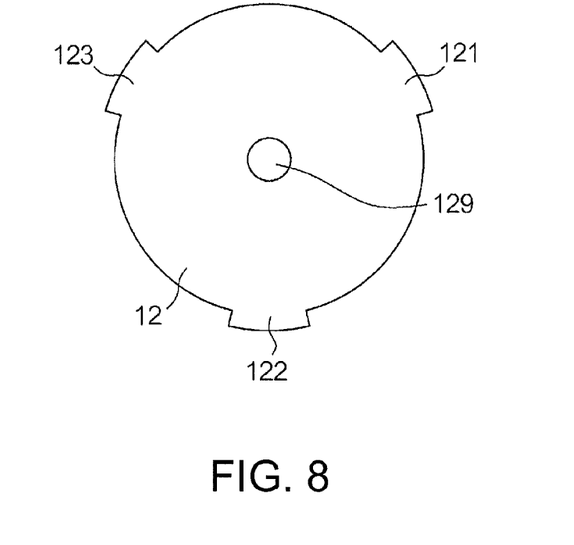
FIG. 8 shows an example of the state after step S3 is carried out.

In step S3, the photocell piece 16 is processed to form the photocell 12. In this example, the photocell 12 is formed by opening a hole in a central portion of the photocell piece 16 (FIG. 8).

Figure 9:
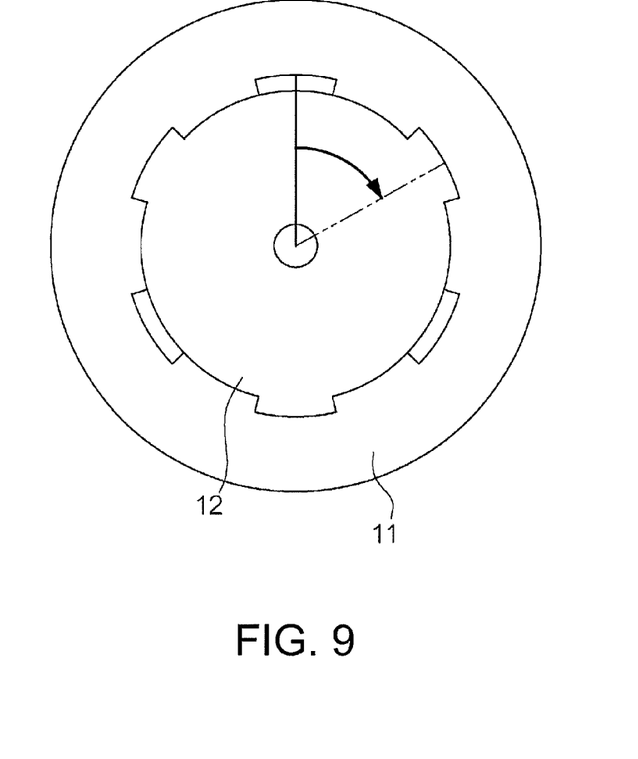
FIG. 9 shows an example of the state after step S4 is carried out.

In step S4, the photocell 11 and the photocell 12 are bonded to each other. In the bonding process, the photocell 12 is rotated relative to the photocell 11 by a predetermined angle around the center of the photocell 12. The angle of the rotation is preferably smaller than the angular interval between the protrusions (120° in this example) and is, for example, one-half the angular interval between the protrusions (60° in this example) (FIG. 9). The photocell 11 and the photocell 12 are bonded to each other by using a solder material or an electrically conductive adhesive.

According to the present embodiment, the step of rotating the two photocells having been produced from a single photocell sheet in the punching processes relative to each other and then bonding them to each other allows a power generator in which the two photocells are connected to each other in series to be manufactured. According to the manufacturing method, no cable that connects the two photocells to each other is required, allowing reduction in the number of parts and the number of manufacturing steps and hence reduction in manufacturing cost.

3. Variations

The invention is not limited to the embodiment described above, and a variety of variations are conceivable. Some variations will be described below. Two or more of the following variations may be combined with each other.

3-1. Variation 1

The photocell 12 does not necessarily have an outer shape based on a circle. That is, the opening of the photocell 11 does not necessarily have a shape based on a circle. The photocell 12 may have an elliptical outer shape, a polygonal outer shape, or any other non-circular outer shape. In this case, the photocell 12 preferably has a rotationally symmetric outer shape. A circle is rotationally symmetric when rotated by an arbitrary angle. In general, a regular polygonal shape having n vertices is rotationally symmetric when rotated by (360/n)° (for example, square is rotationally symmetric when rotated by 90°, a regular pentagon is rotationally symmetric when rotated by 72°, and a regular hexagon is rotationally symmetric when rotated by 60°).

For example, when the photocell 12 has an outer shape based on a regular polygon that is rotationally symmetric when rotated by r [°], the protrusions are preferably provided at angular intervals of 2r [°]. Further, in step S4, the photocell 11 and the photocell 12 are preferably rotated by r [°] relative to each other and then bonded to each other.

3-2. Variation 2

Figure 10:
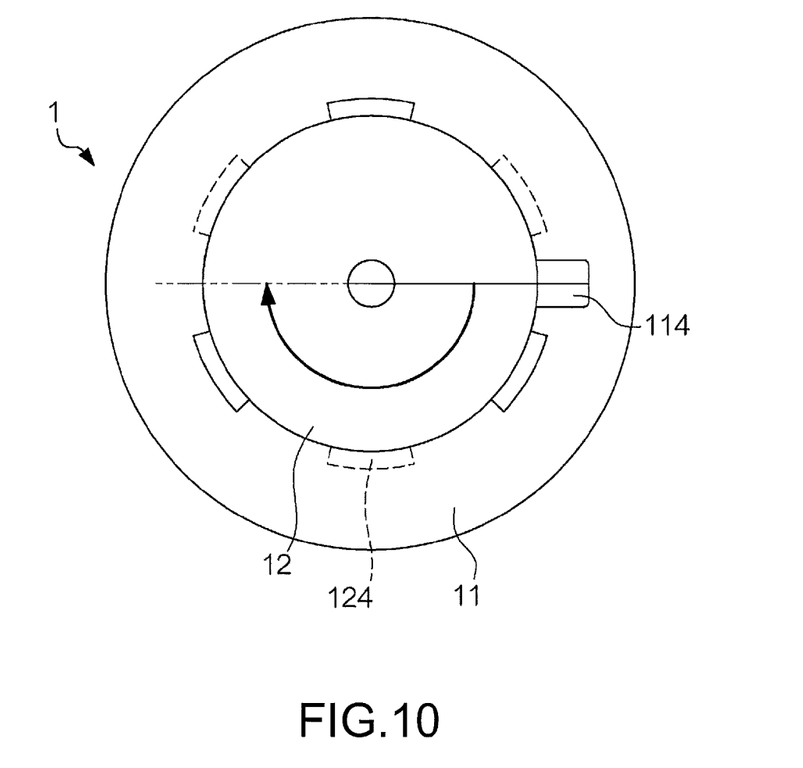
FIG. 10 shows the shapes of photocells according to Variation 2.

FIG. 10 shows the shapes of a photocell 11 and a photocell 12 according to Variation 2. A plurality of protrusions of the photocell 12 may not have a symmetrical shape as a whole. That is, a plurality of recesses of the photocell 11 may not have a symmetrical shape as a whole. In this example, the photocell 11 is provided with recesses 111 to 113 as well as a recess 114. The photocell 12 is provided with a protrusion 124 in correspondence with the recess 114. The recess 114 has a shape and a size different from those of the recesses 111 to 113. In this example, the recess 114 is used as a date window of a dial of a timepiece. The date window is a window that allows a user to view a date displayed on a calendar display plate (not shown) provided on the rear surface of the power generator 1. The protrusion 124 functions as a portion that bonds the photocell 11 and the photocell 12 to each other.

The number of recesses and protrusions of the photocell 11 and the photocell 12 is not limited to the number described in the embodiment. The number of recesses and protrusions may be two or fewer or four or greater. Further, the photocell 11 may be provided with protrusions, and the photocell 12 may be provided with recesses. Moreover, the number of recesses of the photocell 11 and the number of protrusions of the photocell 12 may differ from each other. For example, the photocell 11 may have four recesses, and the photocell 12 may have three protrusions.

3-3. Variation 3

Figure 11:
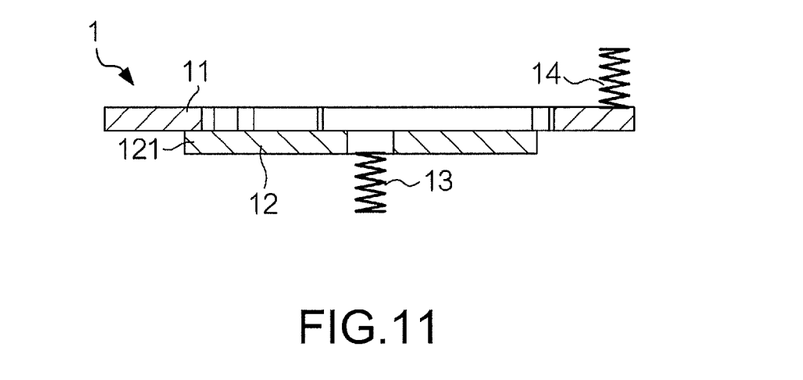
FIG. 11 shows an example of a cross-sectional structure of a power generator according to Variation 3.

FIG. 11 shows an example of a cross-sectional structure of a power generator 1 according to Variation 3. The order in which the photocell 11 and the photocell 12 are layered on each other is not limited to the order described in the embodiment. The two photocells may be layered on each other in the order in which the photocell 12 faces the light receiving surface side. In the example shown in FIG. 11, the electrode 13 is provided in a position corresponding to the hole 129 in the light receiving surface of the photocell 12, and the electrode 14 is provided in a position in the vicinity of the end of the rear surface of the photocell 11.

3-4. Variation 4

Figure 12:
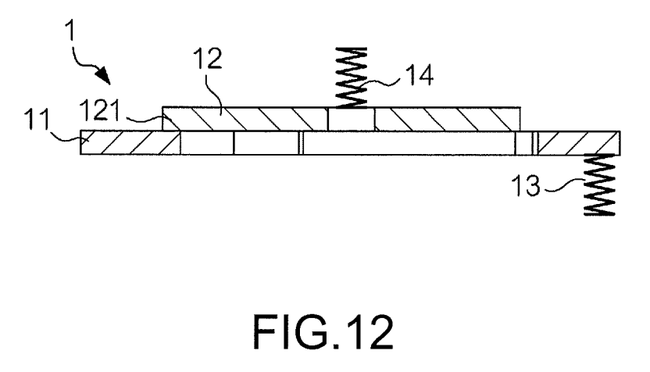
FIG. 12 shows an example of a cross-sectional structure of a power generator according to Variation 4.

FIG. 12 shows an example of a cross-sectional structure of a power generator 1 according to Variation 4. The positions of the electrode 13 and the electrode 14 are not limited to those described in the embodiment. In this example, the electrode 14 is provided in a position corresponding to the hole 129 in the rear surface of the photocell 12.

3-5. Other Variations

Figure 13:
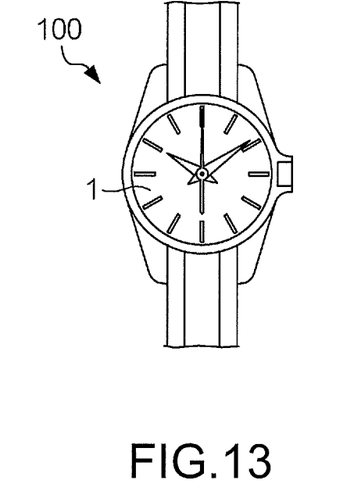
FIG. 13 shows an exterior appearance of a wristwatch.

FIG. 13 shows an exterior appearance of a wristwatch 100 according to an embodiment. In the wristwatch 100, the power generator 1 is used as a dial.

The method for manufacturing the power generator 1 is not limited to the method described with reference to FIG. 4. The steps in FIG. 4 may be reordered. For example, after the photocell piece 16 is produced from the photocell sheet in a punching process, the photocell piece 15 may be produced from the left photocell sheet in a punching process.

An electronic apparatus in which the power generator 1 is used is not limited to a wristwatch. The power generator 1 may be used in an electronic apparatus other than a wristwatch, such as a cellular phone, a mobile communication terminal, and a wearable terminal.

What is claimed is:

1. A method for manufacturing a power generator, the method comprising:
   producing a first piece from a single photocell sheet in a punching process;
   producing a second piece from the first piece in a punching process;
   placing the first piece and the second piece in such a way that a position of a center of an open portion of the first piece coincides with a position of a center of the second piece and rotating the second piece around the position of the center of the second piece in such a way that the first piece and the second piece overlap with each other; and
   connecting overlapping portions of the first piece and the second piece to each other electrically in series.

2. The method for manufacturing a power generator according to claim 1,
   wherein in the placing of the first piece and the second piece, the second piece is so disposed that an area of the first piece that contributes to power generation is equal to an area of the second piece that contributes to power generation.

3. A power generator produced by the method of claim 2.

4. A timepiece comprising:
   a power generator produced by the method of claim 2.

5. A power generator produced by the method of claim 1.

6. A timepiece comprising:
   a power generator produced by the method of claim 1.

\* \* \* \* \*